United States Patent
Alabduljabbar et al.

(10) Patent No.: US 9,406,817 B2
(45) Date of Patent: Aug. 2, 2016

(54) LEAD FRAME PACKAGE FOR SOLAR CONCENTRATORS

(75) Inventors: Ayman A. Alabduljabbar, Riyadh (SA); Abdullah I. Alboiez, Riyadh (SA); Yaseen G. Alharbi, Riyadh (SA); Alhassan Badahdah, Riyadh (SA); Supratik Guha, Chappaqua, NY (US); Hussam Khonkar, Riyadh (SA); Yves C. Martin, Ossining, NY (US); Theodore Gerard van Kessel, Millbrook, NY (US); Robert L. Sandstrom, Chestnut Ridge, NY (US); Naim Moumen, Walden, NY (US)

(73) Assignees: International Business Machines Corporation, Armonk, NY (US); King Abdulaziz City for Science and Technology, Riyadh (SA)

(*) Notice: Subject to any disclaimer, the term of this patent is extended or adjusted under 35 U.S.C. 154(b) by 770 days.

(21) Appl. No.: 13/613,891

(22) Filed: Sep. 13, 2012

(65) Prior Publication Data

US 2014/0069490 A1 Mar. 13, 2014

(51) Int. Cl.
*H01L 31/042* (2014.01)
*H01L 31/02* (2006.01)
*H01L 31/052* (2014.01)
*H01L 31/054* (2014.01)

(52) U.S. Cl.
CPC .... *H01L 31/02013* (2013.01); *H01L 31/02008* (2013.01); *H01L 31/052* (2013.01); *H01L 31/0547* (2014.12); *H01L 2924/0002* (2013.01); *Y02E 10/52* (2013.01)

(58) Field of Classification Search
CPC ............... H01L 31/0508; H01L 31/05; H01L 31/02013; H01L 31/0547
USPC .......................................................... 257/666
See application file for complete search history.

(56) References Cited

U.S. PATENT DOCUMENTS 4,180,414 A * 12/1979 Diamond et al. ............. 136/246
4,200,472 A * 4/1980 Chappell ............... H01L 31/052
136/246

(Continued)

OTHER PUBLICATIONS

Amaral et al., SolAqua, a non static compound parabolic concentrator (CPC) for residential and service buildings, International Conference on Renewable Energy and Power Quality, ICREPQ'06, Palma de Mallorca, Apr. 5-7, 2006.

(Continued)

*Primary Examiner* — Allison Bourke
*Assistant Examiner* — Niki Bakhtiari
(74) *Attorney, Agent, or Firm* — Vazken Alexanian; Michael J. Chang, LLC

(57) ABSTRACT

Techniques for providing high-capacity, re-workable connections in concentrated photovoltaic devices are provided. In one aspect, a lead frame package for a photovoltaic device is provided that includes a beam shield; and one or more lead frame connectors affixed to the beam shield, wherein the lead frame connectors are configured to provide connection to the photovoltaic device when the photovoltaic device is assembled to the lead frame package. A photovoltaic apparatus is also provided that includes a lead frame package assembled to a photovoltaic device. The lead frame package includes a beam shield and one or more lead frame connectors affixed to the beam shield, wherein the lead frame connectors are configured to provide connection to the photovoltaic device.

23 Claims, 8 Drawing Sheets

(56) References Cited

U.S. PATENT DOCUMENTS

| | | | |
|---|---|---|---|
| 4,242,719 A * | 12/1980 | Conley | 361/760 |
| 4,338,480 A * | 7/1982 | Antypas et al. | 136/249 |
| 4,806,106 A * | 2/1989 | Mebane et al. | 439/77 |
| 6,034,319 A | 3/2000 | Falbel | |
| 7,019,387 B1 | 3/2006 | Miks et al. | |
| 7,545,011 B2 | 6/2009 | Horne et al. | |
| 2008/0000516 A1 | 1/2008 | Shifman | |
| 2008/0169020 A1* | 7/2008 | Shiomi et al. | 136/252 |
| 2008/0302410 A1 | 12/2008 | Aoyama | |
| 2009/0025780 A1* | 1/2009 | Nakata | 136/250 |
| 2009/0159122 A1* | 6/2009 | Shook et al. | 136/256 |
| 2009/0205707 A1 | 8/2009 | Ikenoue et al. | |
| 2009/0266395 A1* | 10/2009 | Murthy et al. | 136/206 |
| 2009/0298218 A1* | 12/2009 | Federici et al. | 438/65 |
| 2010/0037936 A1 | 2/2010 | Becker et al. | |
| 2013/0032203 A1* | 2/2013 | Tam et al. | 136/256 |

OTHER PUBLICATIONS

Stefanovic et al., "A Prototype Receiver for Medium Temperature Conversion of Solar Radiation to Heat," Automatic Control and Robotics, vol. 10, No. 1, pp. 37-49 (2011).

Interplex Industries, Inc., "Interplex Introduces New Solar Cell Receiver Package," press release, Jan. 29, 2010, http://www.interplex.com/global/index/new-solar-cell-receiver-package-cpv-release.

\* cited by examiner

FRONT VIEW OF CONNECTOR
104

SIDE VIEW OF CONNECTOR
104

700

LEAD FRAME PACKAGE FOR SOLAR CONCENTRATORS

FIELD OF THE INVENTION

The present invention relates to concentrated photovoltaic devices, and more particularly, to techniques for providing high-capacity, field re-workable connections in concentrated photovoltaic devices.

BACKGROUND OF THE INVENTION

Solar concentrators operate by focusing light to a spot on a photovoltaic cell. The concentrated spot of light enables a small semiconductor to operate at higher power density levels than would be possible in flat solar panels without optical concentration. By using optical concentration, it is possible to construct a photovoltaic system using less semiconductor material, thus desirably lowering production costs.

As a result of optical concentration, the photovoltaic cell produces electric power at high current and with a significant heat load. Thus, measures must be employed to thermally shield the electrical connections and other sensitive components surrounding the photovoltaic cell from the focused light beam. Provisions must also be made to remove the heat load, for which a heat sink is commonly employed.

In order to allow the series connection of concentrated photovoltaic devices (which is often desired), the semiconductor materials of the cells must be electrically insulated from the heat sink materials and from each other. Electrically insulating the cells from the heat sink also allows operators to handle the devices without risk of electric shock. This electrical insulation is usually accomplished by attaching each photovoltaic cell to a ceramic or composite plastic substrate on which top surface metal connection pads are provided.

Standard connectors and cables exist for external connections that are capable of carrying both high current and high voltage direct current (DC) electricity to/from the photovoltaic cells. It is often necessary to make connections using these standard connectors (which are often physically large) to the photovoltaic cell directly or indirectly via conductors on the photovoltaic cell substrate. One method used in the field is to solder both pin and socket connectors directly on the package (the package in this case being the substrate on which the photovoltaic cell is mechanically and electrically affixed). However, the substrate is often made up of thin layers of ceramic and this practice imposes considerable strain on the substrate material and any conductive and insulating coatings that may have been applied to the substrate. In addition this method may restrict the number of contact points through which a large amount of current will be passed.

The components used to construct concentrated solar receivers having a solar cell, cell package (or substrate) and in some cases a heat sink are expensive. It is desirable for cost reasons to be able to remove and rework these assemblies. It is also desirable to be able to re-work or replace receiver components in the field. To this end it is desirable to avoid soldering and other complex process operations.

Therefore, techniques for providing high-capacity, field re-workable connections in concentrated photovoltaic devices would be desirable.

SUMMARY OF THE INVENTION

The present invention provides techniques for providing high-capacity, re-workable connections in concentrated photovoltaic devices. In one aspect of the invention, a lead frame package for a photovoltaic device is provided. The lead frame package includes a beam shield; and one or more lead frame connectors affixed to the beam shield, wherein the lead frame connectors are configured to provide connection to the photovoltaic device when the photovoltaic device is assembled to the lead frame package.

In another aspect of the invention, a photovoltaic apparatus is provided. The photovoltaic apparatus includes a lead frame package assembled to a photovoltaic device. The lead frame package includes a beam shield, and one or more lead frame connectors affixed to the beam shield, wherein the lead frame connectors are configured to provide connection to the photovoltaic device.

A more complete understanding of the present invention, as well as further features and advantages of the present invention, will be obtained by reference to the following detailed description and drawings.

DETAILED DESCRIPTION OF PREFERRED EMBODIMENTS

Figure 1:
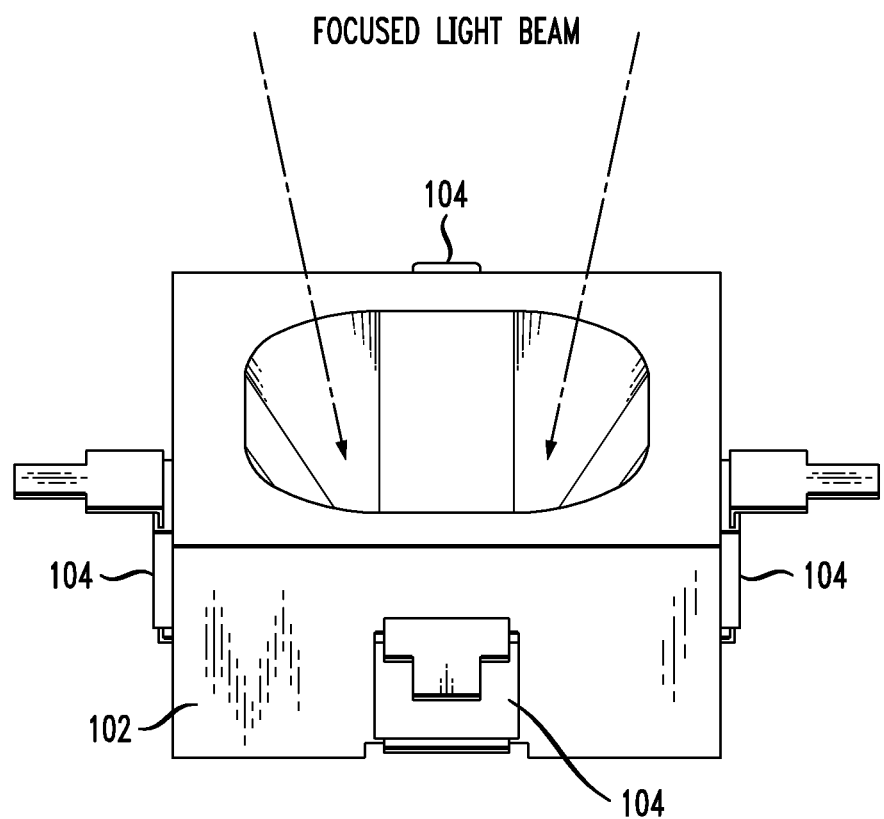
FIG. 1 is a three-dimensional diagram illustrating a lead frame package for a concentrating photovoltaic device according to an embodiment of the present invention.

Provided herein are lead frame package designs for concentrating photovoltaic devices that include field re-workable electrical connections that are mechanically strain relieved and provide many contact points to enable redundant high current capability. The term "lead frame" as used herein refers to a type of package that uses (e.g., metal) leads that extend outside the package. In the following description and accompanying drawings the same structures and components are numbered alike. FIG. 1, for example, is a three-dimensional diagram illustrating a lead frame package 100 for a concentrating photovoltaic device. Lead frame package 100 includes a beam shield 102 and a plurality of lead frame connectors 104 for providing connection to the photovoltaic device.

Figure 4:
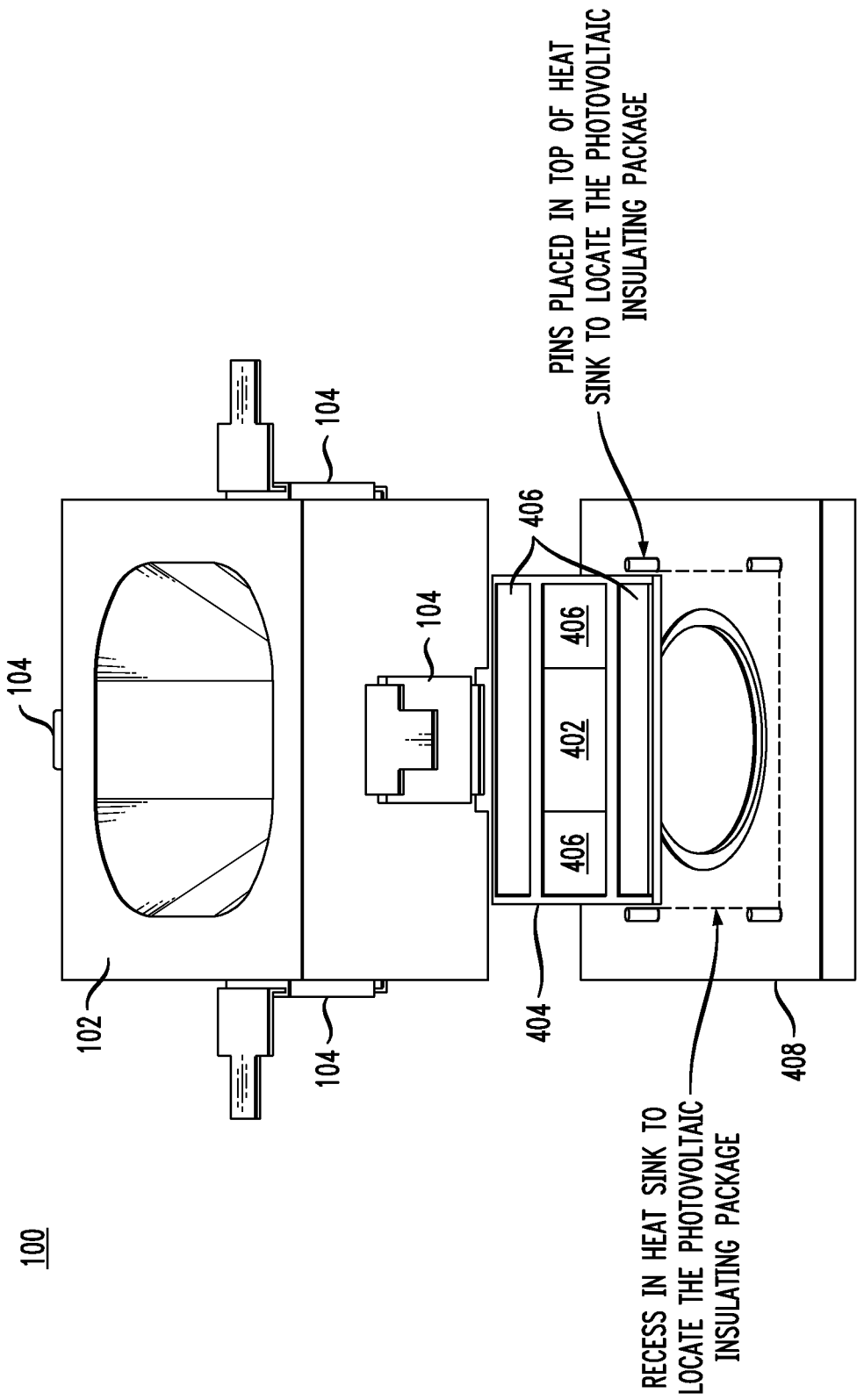
FIG. 4 is a three-dimensional diagram illustrating a top orientation of the lead frame package and its relation to other photovoltaic device components according to an embodiment of the present invention.
Figure 5:
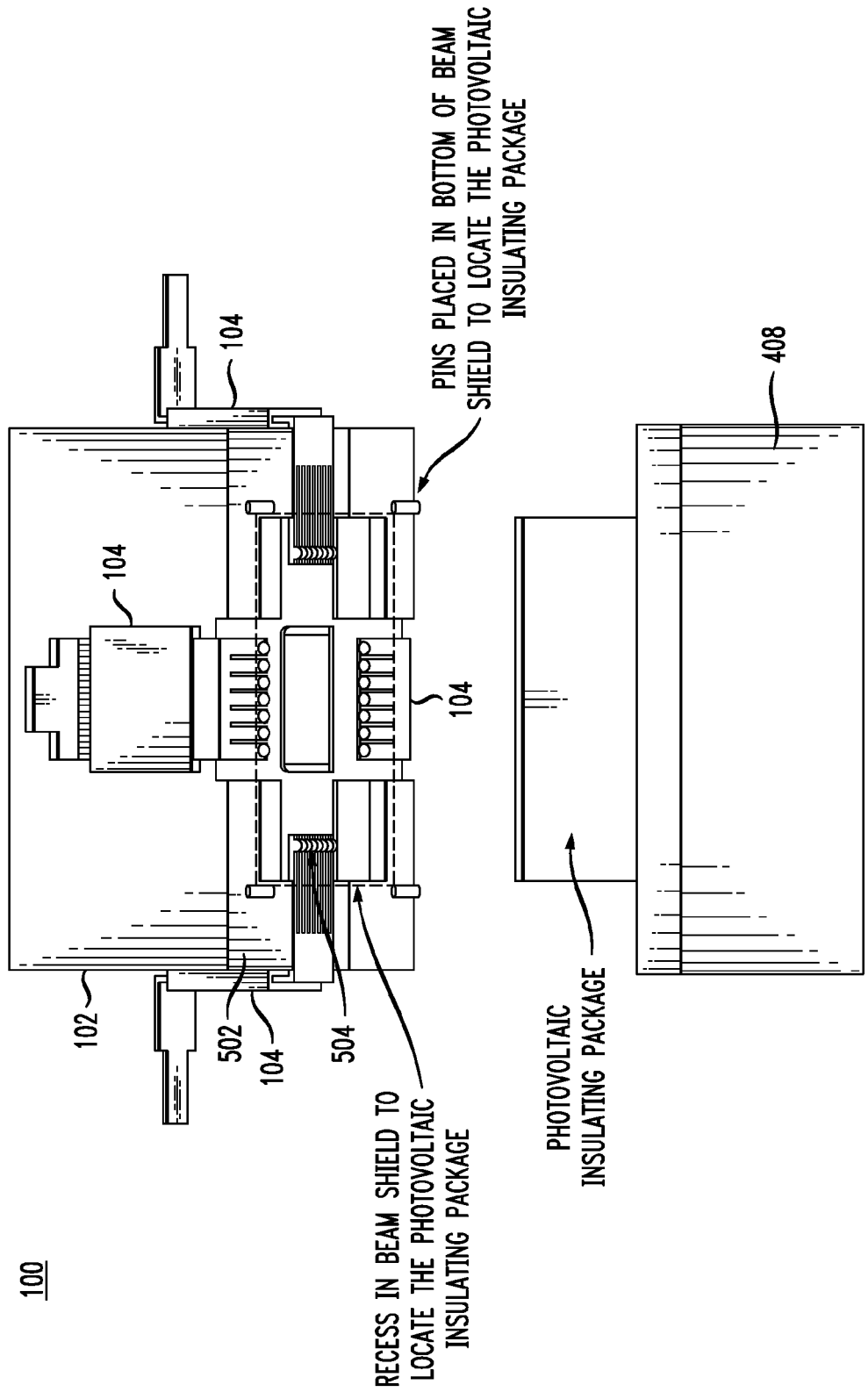
FIG. 5 is a three-dimensional diagram illustrating a bottom orientation of the lead frame package and its relation to the photovoltaic device components according to an embodiment of the present invention.
Figure 6:
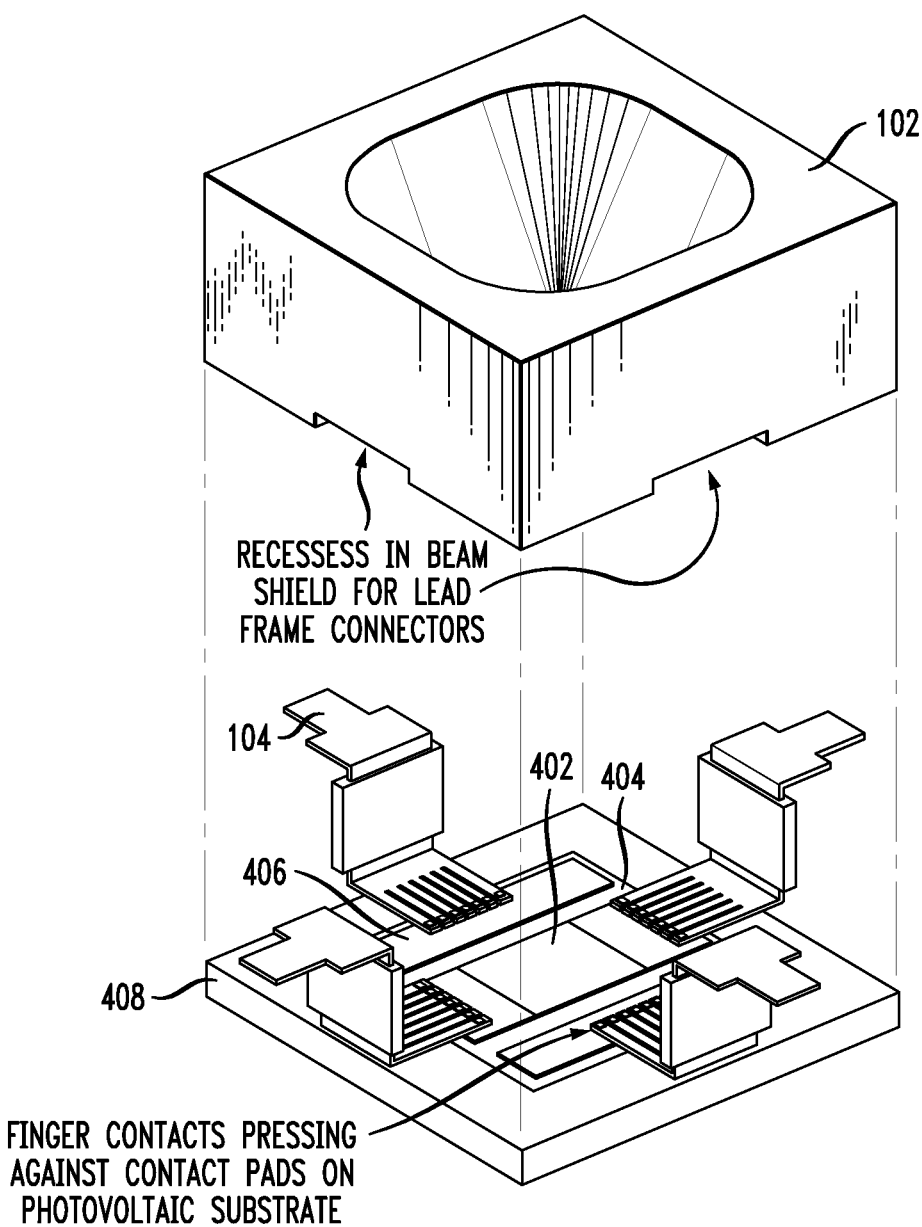
FIG. 6 is a three-dimensional diagram illustrating how the lead frame connectors make contact with contact pads on an insulating wafer and the relative position of a beam shield from a top orientation according to an embodiment of the present invention.

Beam shield 102 serves to thermally shield lead frame connectors 104 and other sensitive components associated with the photovoltaic device from the focused light beam. See FIG. 1. The orientation of the lead frame package relative to the photovoltaic device and related components is shown in FIGS. 4-6, described below.

Figure 8A:
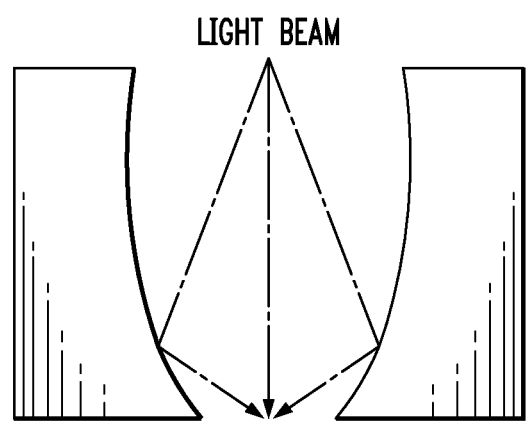
FIG. 8A is a cross-sectional diagram illustrating a beam shield having a light cup with a compound parabolic shape according to an embodiment of the present invention.
Figure 8B:
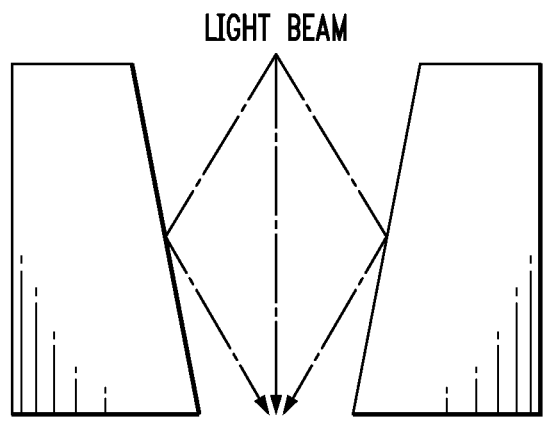
FIG. 8B is a cross-sectional diagram illustrating a beam shield having a light cup with a conical shape according to an embodiment of the present invention.
Figure 8C:
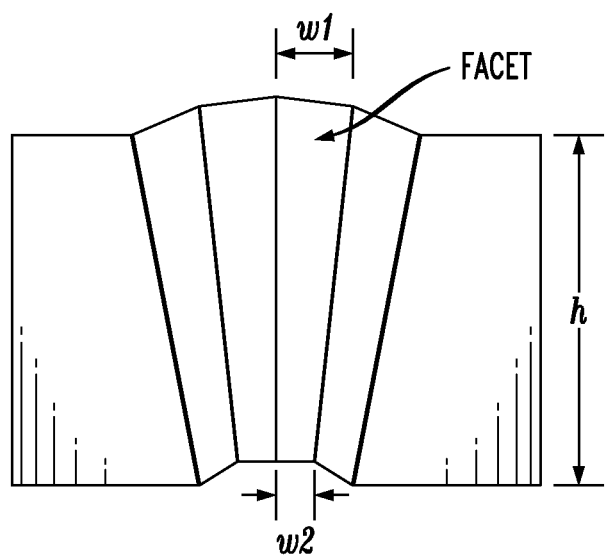
FIG. 8C is a cross-sectional diagram illustrating a beam shield having a light cup with a faceted configuration according to an embodiment of the present invention.

According to an exemplary embodiment, the beam shield 102 shown in FIG. 1 is made of a metal, such as aluminum, to both reflect the light beam and dissipate any absorbed radiation. As shown in FIG. 1, the beam shield 102 may additionally perform the function of a light cup to help guide and homogenize the light on the photovoltaic cell (see FIGS. 8A-C, described below). In another exemplary embodiment, the beam shield is constructed of a simple aluminum plate or shell affixed to the receiver. While aluminum is a suitable material for forming the beam shield 102, in practice any material that meets the objective of being able to withstand direct light beam impingement and either reflect or dissipate the incident power thereby protecting the elements below is suitable. By way of example only, suitable materials for forming the beam shield include, but are not limited to, at least one of aluminum, copper, molybdenum, tin, titanium, magnesium, iron, zinc, silver and gold. If the beam shield 102 is additionally performing the function of a light cup to concentrate and homogenize the light beam to the photovoltaic cell, the reflecting surfaces (of the beam shield 102) will be polished to achieve this goal. A prismatic opening with rounded edges was chosen in one embodiment and is what is shown in the figures. Alternative configurations include, but are not limited to, compound parabolic and conical shapes. Compound parabolic concentrators are shown and described, for example, in Amaral et al., "SolAqua, a non static compound parabolic concentrator (CPC) for residential and service buildings, International Conference on Renewable Energy and Power Quality, ICREPQ'06, Palma de Mallorca, 5-7 Apr. 2006 and Stefanovic et al., "A Prototype Receiver for Medium Temperature Conversion of Solar Radiation to Heat," Automatic Control and Robotics, vol. 10, no. 1, pgs. 37-49 (2011), the contents of each of which are incorporated by reference herein. In one embodiment the surface is faceted on a dimension that is small compared to the dimension of the light cup to scatter light to a more homogeneous spot on the photovoltaic cell. By way of example only a beam shield having a compound parabolic, a conical and a faceted light cup are illustrated in FIGS. 8A-C, respectively, described below.

In the example shown illustrated in FIG. 1, there are four lead frame connectors 104 (one being partially obscured in this depiction by beam shield 102). The lead frame connectors will be described in further detail in conjunction with the description of FIGS. 2 and 3, below. When assembled with a photovoltaic device, the lead frame connectors provide high capacity electrical connections to the photovoltaic device with low series resistance. Further, lead frame connectors 104 are field re-workable. Namely, lead frame connectors 104 may be reversibly affixed to/positioned relative to beam shield 102 in a manner that permits easy exchange of one or more of the connectors to accommodate different device configurations. By comparison, with conventional photovoltaic device packages the connections are typically solder-affixed to the package which does not permit easy re-working of the connections in the field.

Beam shield 102 may serve to coordinate the positioning of the lead frame connectors relative to the photovoltaic device. Namely, according to an exemplary embodiment, beam shield 102 is designed to mechanically support lead frame connectors 104 and locate/position lead frame connectors 104 relative to the photovoltaic package. This exemplary embodiment is described in further detail below.

Figure 2:
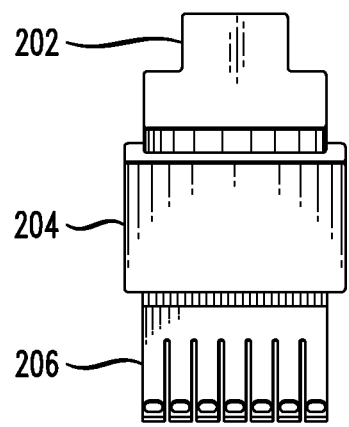
FIG. 2 is a three-dimensional diagram illustrating a front view of a lead frame connector according to an embodiment of the present invention.

FIG. 2 is a three-dimensional diagram illustrating a front view of one of lead frame connectors 104. In the example shown in FIG. 2, each lead frame connector includes a lug connection 202 that is electrically and mechanically joined to one or more finger spring contacts 206. The lead frame connector is partially encapsulated in an insulating material 204 for mechanical support and insulation. According to an exemplary embodiment, the insulating material is a plastic or ceramic sheath around lug connection 202. Since the lead frame package design might have lead frame connectors 104 in contact with the beam shield (see, for example, FIG. 1), insulating material 204 serves to electrically insulate the lead frame connectors from the beam shield, for example when the lead frame connectors are affixed (e.g., by fastener and/or adhesive), see description of FIG. 3, below.

Figure 9A:
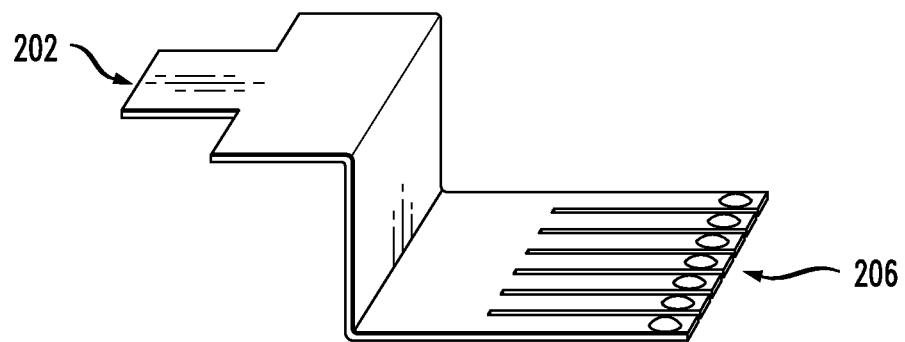
FIG. 9A is a diagram illustrating a lead frame connector having a lug connection and finger spring contacts formed from a single piece of material according to an embodiment of the present invention.

In one exemplary embodiment, the lug connections 202 and the finger spring contacts 206 are formed as one single metallic structure (e.g., the lug connections 202 and the finger spring contacts 206 are formed in a common piece of material). In practice, however, it may be advantageous from a cost and supply perspective to create the lug and spring contacts from two or more separately fabricated components. See, for example, FIGS. 9A and 9B. Both embodiments have been realized. In the latter case, it is possible to create the lug connection 202 from a malleable material such as copper and the finger spring contacts 206 from a more rigid material such as beryllium copper. A malleable copper lug connection 202 can be crimped to a wire thereby simplifying the assembly. In all cases the lug connection 202/finger spring contacts 206 are a continuous electrical structure with low series resistance. When multiple pieces are used to form each lead frame connector, joining may be achieved by a variety of methods including, but not limited to, mechanical (e.g. screw), welding and soldering.

As will be described in detail below, according to an exemplary embodiment, in the assembled package finger spring contacts 206 will be pressed against a metal contact point on the photovoltaic substrate to make contact with the photovoltaic device during use. The number and/or orientation of the finger spring contacts can vary depending on the particular application. By way of example only, the number and/or orientation of the finger spring contacts can vary between lead frame connectors within the same lead frame package and/or from package to package.

In one exemplary embodiment, lug connection 202 and finger spring contacts 206 are gold plated to ensure corrosion free operation and good electrical contact. The base material for lug connection 202 and finger spring contacts 206 can vary depending on the application. According to an exemplary embodiment, the base material for lug connection 202 can be one or more of one of aluminum, brass and copper. For example, lug connection 202 can be gold plated aluminum, brass or copper. The base material for the finger spring contacts 206 may be beryllium copper. Beryllium copper has the advantage of being a hard spring material and is thus a preferred material for forming the finger spring contacts 206. However, other suitable materials for forming the finger spring contacts 206 include, but are not limited to copper, iron, tin, nickel, chrome, gold, silver, platinum, and composite materials and alloys containing at least one of the foregoing metals. For example, the finger spring contacts 206 may be gold plated beryllium copper.

Figure 3:
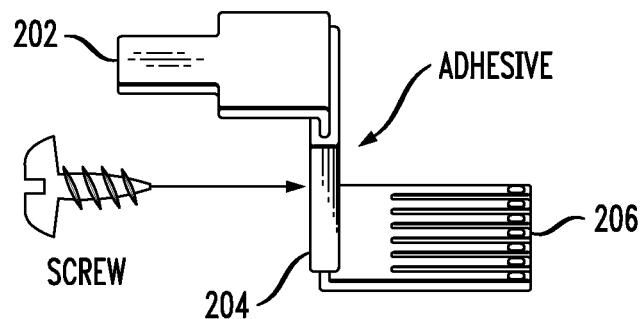
FIG. 3 is a three-dimensional diagram illustrating a side view of a lead frame connector according to an embodiment of the present invention.

FIG. 3 is a three-dimensional diagram illustrating a side view of one of lead frame connectors 104. As shown in this exemplary embodiment, the finger spring contacts 206 are oriented orthogonal to insulating material 204, so as to fit under the beam shield.

According to an exemplary embodiment, the lead frame connectors are affixed to the beam shield with a fastener. See for example FIG. 3. The fastener shown in FIG. 3 is a screw, however any other suitable fastener, such as a pin, rivet, etc. may be employed in the same manner. Further, any other type of mechanical support may be employed to affix the lead frame connectors to the beam shield. By way of example only, a bonding agent such as an adhesive may be used to affix the lead frame connectors to the beam shield. The insulating material 204 prevents contact between the lug connections 202 and/or finger spring contacts 206 and the beam shield while permitting a fastener (such as that shown in FIG. 3, and described above) to affix the lead frame connectors to the beam shield.

Figure 7:
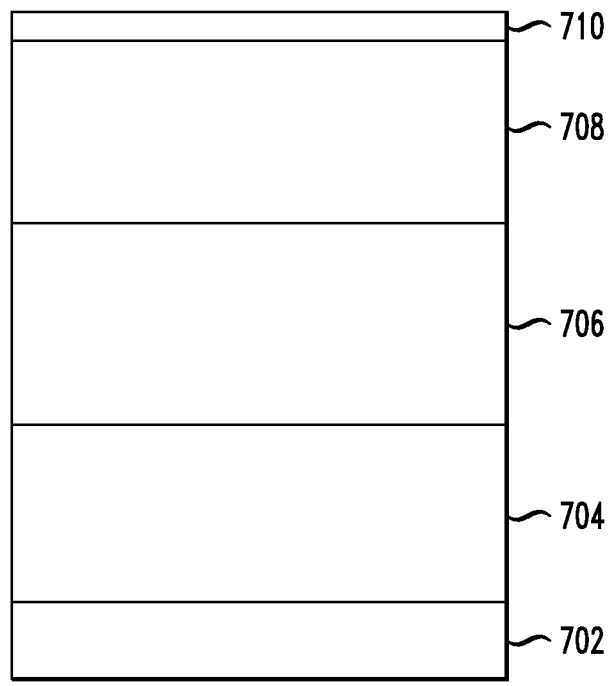
FIG. 7 is a cross-sectional diagram illustrating an exemplary triple junction photovoltaic cell according to an embodiment of the present invention.

FIG. 4 is a three-dimensional diagram illustrating a top orientation of lead frame package 100 and its relation to other photovoltaic device components. The lead frame package and photovoltaic device are also collectively referred to herein as a "photovoltaic apparatus." According to this exemplary embodiment, the photovoltaic device components include a photovoltaic cell 402 on an electrically insulating wafer 404 (also collectively referred to herein as a "photovoltaic insulating package"), contact pads 406 to photovoltaic cell 402 on the insulating wafer, and heat sink 408 (also referred to herein as a "heat sink spreader") in thermal contact with insulating wafer 404 (e.g., by way of thermal interface material therebetween). According to an exemplary embodiment, photovoltaic cell 402 is a multi junction photovoltaic cell. An exemplary multi junction photovoltaic cell is shown in FIG. 7, described below.

When assembled, the finger spring contacts 206 of lead frame connectors 104 make contact with (are pressed against) contact pads 406. This contact scheme is illustrated in further detail in FIG. 6, described below.

As shown in FIG. 4, beam shield 102 mechanically supports lead frame connectors 104 and locates lead frame connectors 104 relative to the photovoltaic insulating package/contact pads 406. For example, according to one embodiment, lead frame connectors 104 are affixed to the beam shield 102 using suitable mechanical connectors or bonding agent (e.g., an adhesive). In one embodiment, each lead frame connector 104 is secured to the beam shield 102 using a mechanical fastener through a hole (not shown) provided in the lead frame connector. In one embodiment the mechanical fastener is a screw. In the case where a screw is used as a fastener, provisions should be made to insulate the screw from the lead frame connector 104 itself. Plastic washers (including, nylon, fiberglass, etc.) may be used for this purpose.

In one exemplary embodiment, the heat sink 408 contains a recess machined therein that is complementary to the outer dimensions of the photovoltaic insulating package. This recess ensures that, when assembled, the photovoltaic insulating package is properly oriented vis-à-vis the lead frame package such that the finger spring contacts of the lead frame connectors 104 properly contact the contact pads on the photovoltaic insulating package. As will be described in conjunction with the description of FIG. 5, below, this recess may instead be located in the bottom surface of the beam shield thereby serving the same purpose. Alternatively (or in addition to) the recess in the heat sink or beam shield, a pin(s) may be employed to in the same manner ensure that when assembled the photovoltaic insulating package is properly oriented vis-à-vis the lead frame package such that the finger spring contacts of the lead frame connectors 104 properly contact the contact pads on the photovoltaic insulating package. By way of example only, in the exemplary embodiment shown in FIG. 4, four pins are located in the heat sink, the positioning of the pins corresponding to the four corners of the photovoltaic insulating package, thereby precisely constraining the lateral position of the photovoltaic insulating package. As provided above, the pins may be employed independently of the recess or vice-a-versa, or alternatively the pins and the recess may be jointly employed.

FIG. 5 is a three-dimensional diagram illustrating another orientation, i.e., a bottom orientation, of the lead frame package 100 and its relation to the photovoltaic device components. As can be seen from this orientation, the beam shield 102 has thermal contact pads 502 on a bottom surface thereof that, when the package is assembled thermally insulates beam shield 102 from heat sink 408. The contact pads (which according to an exemplary embodiment are simply an extending portion(s) of the beam shield) make a thermal and mechanical contact with the heat sink 408. Further, a thermal interface material may be employed between the beam shield (i.e., the contact pads) and heat sink to allow heat to escape from the beam shield to the heat sink. A single sheet or multiple sheets of the thermal interface material (e.g., a phase change material), a thermal grease, a soft metal, etc. may be applied to the bottom of the beam shield on the thermal contact pads 502. In one embodiment the thermal interface material is thermally conductive but electrically insulating to electrically isolate the beam shield from the heat sink while permitting efficient cooling of the beam shield. In some embodiments the beam shield is reflective. In these embodiments, the heating is minimal and the thermal interface material may be less thermally conductive. Phase change thermal interface materials are commercially available, for example, from AI technology, Inc., Princeton Junction, N.J.

The finger spring contacts may be dimpled. Namely, as also can be seen from this orientation, each of the finger spring contacts preferably has dimpled contact points 504 at the end of each "finger." These dimpled contact points ensure proper contact with the photovoltaic insulating package/contact pads. Use of dimpled contact points is known to those of skill in the art and thus is not described further herein.

As described, for example, in conjunction with the description of FIG. 4 above, a recess may be machined either in the heat sink or in the heat shield to constrain the lateral position of the photovoltaic insulating package. Having the recess in the heat sink was shown in FIG. 4. The alternative where the recess is in the bottom of the heat shield is shown illustrated in FIG. 5. Namely, as shown in FIG. 5, according to one exemplary embodiment, the bottom of beam shield 102 contains a recess machined therein that is complementary to the outer dimensions of the photovoltaic insulating package. This recess ensures that, when assembled, the photovoltaic insulating package is properly oriented vis-à-vis the lead frame package such that the finger spring contacts of the lead frame connectors 104 properly contact the contact pads on the photovoltaic insulating package. Alternatively (or in addition to)

the recess in the heat sink or beam shield, a pin(s) may be employed to in the same manner ensure that when assembled the photovoltaic insulating package is properly oriented vis-à-vis the lead frame package such that the finger spring contacts of the lead frame connectors 104 properly contact the contact pads on the photovoltaic insulating package. By way of example only, in the exemplary embodiment shown in FIG. 5, four pins are located in the beam shield, the positioning of the pins corresponding to the four corners of the photovoltaic insulating package, thereby precisely constraining the lateral position of the photovoltaic insulating package. As provided above, the pins may be employed independently of the recess or vice-a-versa, or alternatively the pins and the recess may be jointly employed.

FIG. 6 is a three-dimensional diagram illustrating how the lead frame connectors 104 make contact with the contact pads 406 on insulating wafer 404 and the relative position of the beam shield 102 from a top orientation. As shown in FIG. 6, when assembled, finger spring contacts 206 of lead frame connectors 104 press against contact pads 406 on insulating wafer 404. As highlighted above, each of the finger spring contacts can have dimpled contact points at the end of each "finger," thus ensuring proper contact with the contact pads. It is notable that the optional pins and/or recess in the heat sink (used to locate and restrain movement of the photovoltaic insulating package as described above) are not shown in this depiction.

Also visible in FIG. 6 are the recesses in beam shield 102 for lead frame connectors 104 (i.e., for coordinating positioning of the lead frame connectors 104). Namely, when beam shield 102 is assembled to heat sink 408, the recesses will center lead frame connectors 104 on contact pads 406.

A further attribute of the embodiments shown is that when fully assembled finger spring contacts 206 press the photovoltaic insulating package against heat sink 408. During operation, heat must be removed from both beam shield 102 and the photovoltaic insulating package. The thermal contact pads 502 on the beam shield 102, as described above, contact heat sink 408 and make mechanical and thermal contact with heat sink 408 through the use of a thermal interface material. The photovoltaic insulating package also makes thermal and mechanical contact with heat sink 408.

To increase heat transfer efficiency from beam shield 102 to heat sink 408 and/or from the photovoltaic insulating package to heat sink 408, a thermal interface material (not shown) might be used at these interfaces. Specifically, a thermal interface material can be present between the beam shield 102 and the heat sink 408 and/or between the photovoltaic insulating package and heat sink 408. As described above, a thermal interface material may be used between the thermal contact pads 502 on the beam shield 102 and the heat sink 408 to facilitate the removal of heat from the beam shield 102. A thermal interface material increases heat transfer efficiency by increasing thermal contact between the respective surfaces. As provided above, suitable thermal interface materials include, but are not limited to, thermal grease such as Krytox® grease (available from E.I. du Pont de Nemours and Company, Wilmington, Del.), a conductive particle infused thermal grease, a liquid metal, a solid soft metal alloy and a phase change material.

Since the components of the lead frame package are unitized and non-permanently attached to one another, the present package designs are field re-workable/replaceable. This re-workable configuration is beneficial for a variety of reasons. In one case the cell and package components are expensive and the ability to recover and continue to use components may reduce costs. In a second case where cells are connected in series without isolation diodes, the failure of a single cell would compromise the entire string thereby magnifying the cost of failure. In this case the ability to rework would eliminate the need for expensive isolation diodes on a per cell basis. In a third case, cell designs continue to improve. It is advantageous to replace less efficient cells with more efficient cells as they become available without the need to replace the balance of the system. Each of these cases must be examined in the context of a particular embodiment to determine the most cost effective strategy for rework.

FIG. 7 is a diagram illustrating a cross-sectional view of exemplary triple junction photovoltaic cell 700. Triple junction photovoltaic cell 700 represents one possible configuration of photovoltaic cell 402. Triple-junction photovoltaic cell 700 comprises substrate 702, photovoltaic cells 704, 706 and 708 and anti-reflective coating 710. According to an exemplary embodiment, substrate 702 comprises a germanium (Ge) substrate and has a thickness of about 200 micrometers (μm). A photovoltaic cell, such as triple-junction photovoltaic cell 700, can have an overall thickness of less than about one millimeter (mm).

Photovoltaic cell 704 may be separated from photovoltaic cell 706 by a tunnel diode (not shown). Similarly, photovoltaic cell 706 may be separated from photovoltaic cell 708 by a tunnel diode (not shown). Each of photovoltaic cells 704, 706 and 708 should be configured such that, collectively, photovoltaic cells 704, 706 and 708 absorb as much of the solar spectrum as possible. By way of example only, photovoltaic cell 704 can comprise Ge, photovoltaic cell 706 can comprise gallium arsenide (GaAs) and photovoltaic cell 708 can comprise gallium indium phosphide (GaInP).

As described above, the beam shield may serve as a light cup, and the light cup may have several different configurations. Namely, in addition to a prismatic opening with rounded edges shown FIGS. 1 and 4-6, the beam shield light cup may also have a compound parabolic (FIG. 8A), a conical (FIG. 8B) or a faceted (FIG. 8C) shape. FIGS. 8A and 8B illustrate how the light cup shape helps reflect the light beam. The faceted configuration would reflect the light beam in the same manner as that shown in the conical configuration. Further, as highlighted above, in the faceted configuration the surface is preferably faceted on a dimension that is small compared to the dimension of the light cup. Thus, for example, by way of reference to FIG. 8C, it is shown that the light cup has a height h and each facet has a first width w1 at the top opening of the light cup and a second width w2 at the bottom opening of the light cup. According to an exemplary embodiment, an average (wavg) of these two widths, i.e., w1+w2 divided by 2, is less than ¼ h, e.g., wavg is from about ⅛ h to about ¼ h.

Figure 9B:
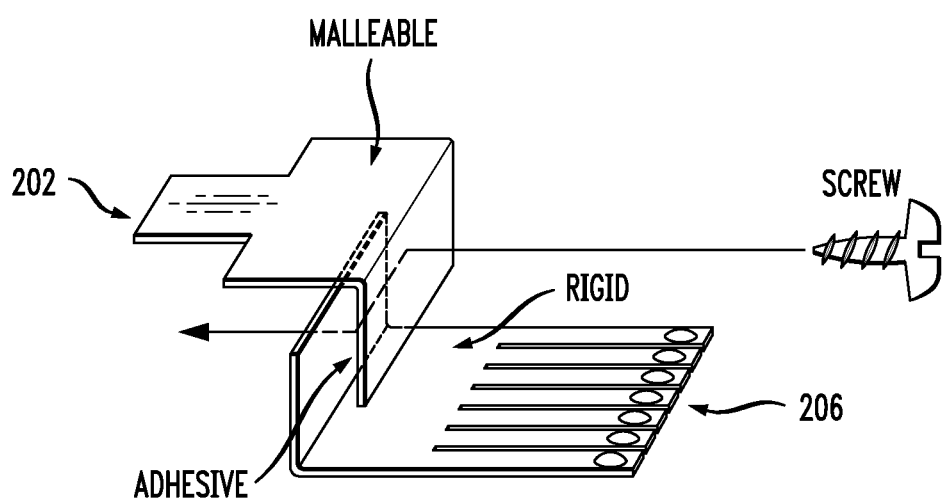
FIG. 9B is a diagram illustrating a lead frame connector having a lug connection and finger spring contacts formed from two different materials according to an embodiment of the present invention.

As described above, the lead frame connectors presented herein may each have a lug connection and finger spring contacts formed from a single piece of material (see FIG. 9A) or from multiple different materials (see FIG. 9B). As shown in FIG. 9B, when the lead frame connector is formed from multiple pieces, the pieces (i.e., the lug connection and the finger spring contacts) may be joined together using a fastener (or alternatively using an adhesive). The fastener shown in FIG. 9B is a screw, however any other suitable fastener, such as a pin, rivet, etc. may be employed in the same manner.

As described above, employing the configuration shown in FIG. 9B allows the use of different materials (tailored to their particular application). For instance, the lug connection 202 can be formed from a first, malleable material such as copper and the finger spring contacts 206 can be formed from a second, more rigid material such as beryllium copper, which are then joined together in the manner shown in FIG. 9B.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A lead frame package for a photovoltaic device, comprising:
    a beam shield; and
    one or more lead frame connectors detachably affixed to the beam shield, wherein the lead frame connectors are configured to provide connection to the photovoltaic device when the photovoltaic device is assembled to the lead frame package,
    wherein each of the lead frame connectors comprises a lug connection connected to one or more finger spring contacts, wherein each of the lead frame connectors is partially encapsulated in an insulating material with the finger spring contacts oriented orthogonal to the insulating material, and wherein each of the lead frame connectors are detachably affixed to the beam shield with a fastener that passes through the insulating material in a manner such that when the lead frame connectors are affixed to the beam shield the insulating material prevents direct contact between the lug connection or the finger spring contacts and the beam shield.

2. The lead frame package of claim 1, wherein the lug connection is formed from one or more of gold plated aluminum, brass or copper.

3. The lead frame package of claim 1, wherein the finger spring contacts are formed from gold plated beryllium copper.

4. The lead frame package of claim 1, wherein the insulating material comprises a plastic or a ceramic sheath around the lug connection.

5. The lead frame package of claim 1, wherein the finger spring contacts are dimpled.

6. The lead frame package of claim 1, wherein the fastener is a screw.

7. The lead frame package of claim 1, wherein the beam shield comprises recesses in a bottom surface thereof in which the lead frame connectors fit, the recesses being configured to restrain movement of the lead frame connectors and to position the lead frame connectors relative to the photovoltaic device when the photovoltaic device is assembled to the lead frame package.

8. The lead frame package of claim 1, wherein the beam shield comprises a light cup, and wherein the light cup has at least one of a compound parabolic, a conical and a faceted shape.

9. A photovoltaic apparatus, comprising:
    a lead frame package assembled to a photovoltaic device, wherein the lead frame package comprises a beam shield and one or more lead frame connectors detachably affixed to the beam shield, wherein the lead frame connectors are configured to provide connection to the photovoltaic device, wherein each of the lead frame connectors comprises a lug connection connected to one or more finger spring contacts, wherein each of the lead frame connectors is partially encapsulated in an insulating material with the finger spring contacts oriented orthogonal to the insulating material, and wherein each of the lead frame connectors are detachably affixed to the beam shield with a fastener that passes through the insulating material in a manner such that when the lead frame connectors are affixed to the beam shield the insulating material prevents direct contact between the lug connection or the finger spring contacts and the beam shield.

10. The photovoltaic apparatus of claim 9, wherein the photovoltaic device comprises:
    a photovoltaic cell on an electrically insulating wafer;
    contact pads to the photovoltaic cell on the insulating wafer; and
    a heat sink in thermal contact with the insulating wafer.

11. The photovoltaic apparatus of claim 10, further comprising:
    a thermal interface material directly in between the heat sink and the insulating wafer, wherein the thermal interface material is configured to enhance thermal contact between the heat sink and the insulating wafer.

12. The photovoltaic apparatus of claim 11, wherein the thermal interface material comprises one or more of thermal grease, a conductive particle infused thermal grease, a liquid metal, a solid soft alloy and a phase change material.

13. The photovoltaic apparatus of claim 10, wherein the beam shield is in thermal contact with the heat sink for efficient cooling of the beam shield.

14. The photovoltaic apparatus of claim 13, further comprising:
    a thermal interface material between the beam shield and the heat sink, wherein the thermal interface material is configured to enhance thermal contact between the beam shield and the heat sink.

15. The photovoltaic apparatus of claim 14, wherein the thermal interface material comprises one or more of thermal grease, a conductive particle infused thermal grease, a liquid metal, a solid soft alloy and a phase change material.

16. The photovoltaic apparatus of claim 10, wherein the finger spring contacts are pressed against the contact pads on the insulating wafer.

17. The photovoltaic apparatus of claim 10, wherein the photovoltaic cell is a multi junction photovoltaic cell.

18. The photovoltaic apparatus of claim 10, wherein the beam shield has a recess in a bottom surface thereof and wherein the photovoltaic cell and the insulating wafer fit into the recess in the beam shield.

19. The photovoltaic apparatus of claim 10, wherein the heat sink has a recess in a top surface thereof and wherein the photovoltaic cell and the insulating wafer fit into the recess in the heat sink.

20. The photovoltaic apparatus of claim 10, wherein the beam shield has pins extending from a bottom surface thereof that are configured to restrain movement of the photovoltaic cell and the insulating wafer.

21. The photovoltaic apparatus of claim 10, wherein the heat sink has pins extending from a top surface thereof that are configured to restrain movement of the photovoltaic cell and the insulating wafer.

22. The lead frame package of claim 1, wherein each of the lead frame connectors comprises:
    a first piece comprising the lug connection;
    and a second piece comprising the finger spring contacts, wherein the first piece is joined to the second piece using the fastener, and wherein the first piece is formed from a different material than the second piece.

23. The lead frame package of claim 1, wherein the beam shield comprises a light cup, and wherein the light cup has a compound parabolic shape.

* * * * *